United States Patent
Oh et al.

(10) Patent No.: US 9,121,874 B2
(45) Date of Patent: Sep. 1, 2015

(54) METHOD AND APPARATUS FOR MEASURING RADIATED POWER OF ANTENNA

(71) Applicant: ELECTRONICS AND TELECOMMUNICATIONS RESEARCH INSTITUTE, Daejeon (KR)

(72) Inventors: Soon-Soo Oh, Daejeon (KR); Young Hwan Lee, Daejeon (KR); Hyung Do Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 155 days.

(21) Appl. No.: 13/738,228

(22) Filed: Jan. 10, 2013

(65) Prior Publication Data

US 2013/0249746 A1 Sep. 26, 2013

(30) Foreign Application Priority Data

Mar. 22, 2012 (KR) ........................ 10-2012-0029289

(51) Int. Cl.
 *G01R 29/10* (2006.01)
(52) U.S. Cl.
 CPC .................... *G01R 29/105* (2013.01)
(58) Field of Classification Search
 USPC .................... 343/703, 766, 882, 765
 See application file for complete search history.

(56) References Cited

U.S. PATENT DOCUMENTS

| | | | |
|---|---|---|---|
| 8,330,661 B2 | 12/2012 | Oh et al. | |
| 2008/0129615 A1* | 6/2008 | Breit et al. | 343/703 |
| 2009/0160706 A1 | 6/2009 | Oh et al. | |
| 2009/0219217 A1* | 9/2009 | Kitada et al. | 343/703 |
| 2009/0231224 A1* | 9/2009 | Felstead et al. | 343/766 |
| 2010/0207827 A1 | 8/2010 | Oh et al. | |

FOREIGN PATENT DOCUMENTS

| | | |
|---|---|---|
| KR | 1020070101096 A | 10/2007 |
| KR | 10-0826527 B1 | 4/2008 |
| KR | 1020090029978 A | 3/2009 |
| KR | 1020090049063 A | 5/2009 |

* cited by examiner

*Primary Examiner* — Dieu H Duong
(74) *Attorney, Agent, or Firm* — Ladas & Parry LLP

(57) ABSTRACT

An apparatus for measuring radiated power of an antenna includes a chamber which an absorber is attached to a wall thereof; a source antenna and a test antenna configured to be arranged within the chamber; a rotational axis configured to adjust an arrangement angle of the test antenna in up-and-down directions; and a roll positioner configured to rotate the test antenna. Further, the apparatus includes a turntable configured to be provided within the chamber and be rotated in a left-to-right direction; a connection unit configured to allow the test antenna, to rotate in the left-to-right direction; and a supporting unit configured to be rotatably connected to one end of the rotational axis which the other end thereof is rotatably connected to the roll positioner.

6 Claims, 6 Drawing Sheets

METHOD AND APPARATUS FOR MEASURING RADIATED POWER OF ANTENNA

CROSS-REFERENCE TO RELATED APPLICATION(S)

The present invention claims priority of Korean Patent Application No. 10-2012-0029289, filed on Mar. 22, 2012, which is incorporated herein by reference.

FIELD OF THE INVENTION

The present invention relates to measuring antenna radiated power; and more particularly, to an apparatus and a method for measuring radiated power of a high-gain antenna.

BACKGROUND OF THE INVENTION

Generally, a far-field measurement method, a near-field measurement method, a Fresnel Zone measurement method and the like may be enumerated as methods for measuring the radiation property of an antenna.

Among these, the far-field measurement method has an advantage of obtaining a desired value by one injection, but has a disadvantage that the size of a chamber needs to be large because keeping a distance between a sources antenna and a test antenna as much as far-field condition is required.

The distance satisfying the far-field condition is $R=2*D2/\lambda$, and D is the diameter of an antenna aperture, $\lambda$ is the wavelength of a measurement frequency. For example, a gap filler antenna having a size 2 meter and a frequency of 0.8 GHz needs to secure distance of more than 22 meters from the source antenna. Therefore, a large chamber having a size of more than 30 m is necessary, considering size of an absorber and location of a positioner and the like.

The near-field measurement method may be applied within a small chamber because it is performed at a distance closer than that of the far-field measurement method. However, it takes a long time to obtain all the data because it is necessary to obtain the value of power at an interval smaller than a half-wavelength. Further, it takes a long time to convert near-field to far-field.

The Fresnel Zone measurement method may be performed within a small chamber having a size equal to or smaller than ⅕ times of far field chamber because it is performed in a middle distance of those of the far field measurement method and near field measurement method. In terms of a size of the antenna to be measured, a maximum size of the antenna which can be far-field chamber may be increased to two time or more of that of the existing antenna is compared. Further, in terms of time for obtaining and converting data, the equal to or more than one several times time may be shortened in comparison with the existing near-field measurement method.

The Fresnel Zone measurement method according to the prior art, may be classified into alpha angle change method, height change method, and phi angle change method depending on a scanning method. The alpha angle change method needs a positioner and a turntable capable of changing an altitude angle because scan is performed while changing an altitude angle between a plane of a source antenna and that of a test antenna. The height change method needs a height adjustable positioner and a turntable because the scan is performed while changing the height of the source antenna or the test antenna. The phi angle change method needs two positioners and a turntable because the scan is performed while changing the phi angle between the source antenna and the test antenna. Because the far-field chamber has two positioners and a turntable, the phi angle change method may be easily applied thereto.

However, a high-gain antenna typically weighs much so that the torque of the motor needs to be significantly large in order for rotating a roll angle of the test antenna to 360 degrees. Further, a linear antenna such as a gap filler antenna has a large amount of rear radiation so that it is much influenced by the roll positioned. Therefore, it is difficult to calculate accurate gain and patterns.

SUMMARY OF THE INVENTION

In view of the above, the present invention provides a method and apparatus for measuring radiated power of an antenna, which are capable of measuring radiated power of a large high-gain antenna using a roll positioner having low torque in small and medium chamber which does not satisfy far-field conditions.

For example, the radiated power of the antenna may be measured within a small chamber having a size corresponding to one several times of that of the existing far-field chamber in order to generate far-field parameters of a high-gain antenna, or the maximum size of the antenna which can be measured may be increased to several times or more.

In accordance with a first aspect of the present invention, there is provided an apparatus for measuring radiated power of an antenna, including: a chamber which an absorber is attached to a wall thereof; a source antenna and a test antenna configured to be arranged within the chamber; a rotational axis configured to adjust an arrangement angle of the test antenna in up-and-down directions; a roll positioner configured to rotate the test antenna while making the rotational axis a center to adjust the arrangement angle in the up-and-down directions; a turntable configured to be provided within the chamber and capable of rotating in a left-to-right direction orthogonal to the up-and-down directions; a connection unit configured to allow the test antenna to rotate in the left-to-right direction while the turntable is being rotated; and a supporting unit configured to be rotatably connected to one end of the rotational axis which the other end thereof is rotatably connected to the roll positioned.

The connection unit may be configured such that one end of the connection unit is connected to the turntable and the other end of the connection unit is connected to the roll positioner for the test antenna to be rotated in the up-and-down directions.

Further, the rotational axis may pass through a center of the test antenna while being connected to a rotation point of the roll positioner.

Further, the rotational axis may include a main axis connected to the rotation point of the roll positioner and protrusions connected to the main axis and protruded toward the source antenna, and the test antenna is connected to the protrusions.

In accordance with a second aspect of the present invention, there is provided a method for measuring radiated power of an antenna. The method includes setting an angle in which a test antenna is arranged with reference to a source antenna by driving the roll positioner which adjusts the angle of the test antenna in up-and-down directions among the source antenna and the test antenna which are arranged within the chamber which an absorber is attached to a wall thereof; setting an angle in which the test antenna is arranged with reference to the source antenna by rotating a turntable which is provided in the chamber and is rotatable in the left-to-right directions orthogonal to the up-and-down directions to rotate the test antenna connected to the turntable through the connection unit in the left-to-right directions; measuring received power of the test antenna at the angles which the test antenna is arranged in the up-and-down directions and left-to-right direction; repeatedly measuring the received power of the test antenna predetermined times while driving the roll positioned to adjust the angle which the test antenna is arranged in the up-and-down directions and driving the turntable to adjust the angle which the test antenna is arranged in the left-and-right direction; and generating a far-field radiation pattern using the repeatedly measured values of the received power.

The method may further comprise, when the test antenna is protrudedly provided from the rotational axis of the roll positioner through the protrusion, calculating a positional characteristic value of the test antenna, which includes an angle which the test antenna is arranged with reference to the source antenna; and generating the far-field radiation pattern using the result value of the received power and the positional characteristic value.

In accordance with the present invention, the radiated power of a large high-gain antenna may be measured in small and medium-sized chamber which does not satisfy far-field conditions. For example, the radiated power of the high-gain antenna may be measured within a small chamber having a size of one several times in comparison with an existing chamber. Further, the radiated power may be measured even in an antenna which is one several times larger than an antenna in the existing chamber.

In addition, most of the chamber having the antennal measuring the radiated power has a turntable and a roll positioner for changing a roll angle, the present invention may be applied immediately even though the roll positioner has a low torque.

Further, the apparatus and method for measuring the radiated power of the antenna may be applied to not only the Fresnel Zone measurement method but also the far-field measurement method, the near-field measurement method and the like if a rotation center of the antenna is different to that of the turntable.

BRIEF DESCRIPTION OF THE DRAWINGS

The objects and features of the present invention will become apparent from the following description of embodiments given in conjunction with the accompanying drawings, in which.

DETAILED DESCRIPTION OF THE EMBODIMENTS

Advantages and features of the invention and methods of accomplishing the same may be understood more readily by reference to the following detailed description of embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims.

In the following description of the present invention, if the detailed description of the already known structure and operation may confuse the subject matter of the present invention, the detailed description thereof will be omitted. The following terms are terminologies defined by considering functions in the embodiments of the present invention and may be changed operators intend for the invention and practice. Hence, the terms need to be defined throughout the description of the present invention Hereinafter, embodiments of the present invention will be described in detail with reference to the accompanying drawings which form a part hereof.

Figure 1A:
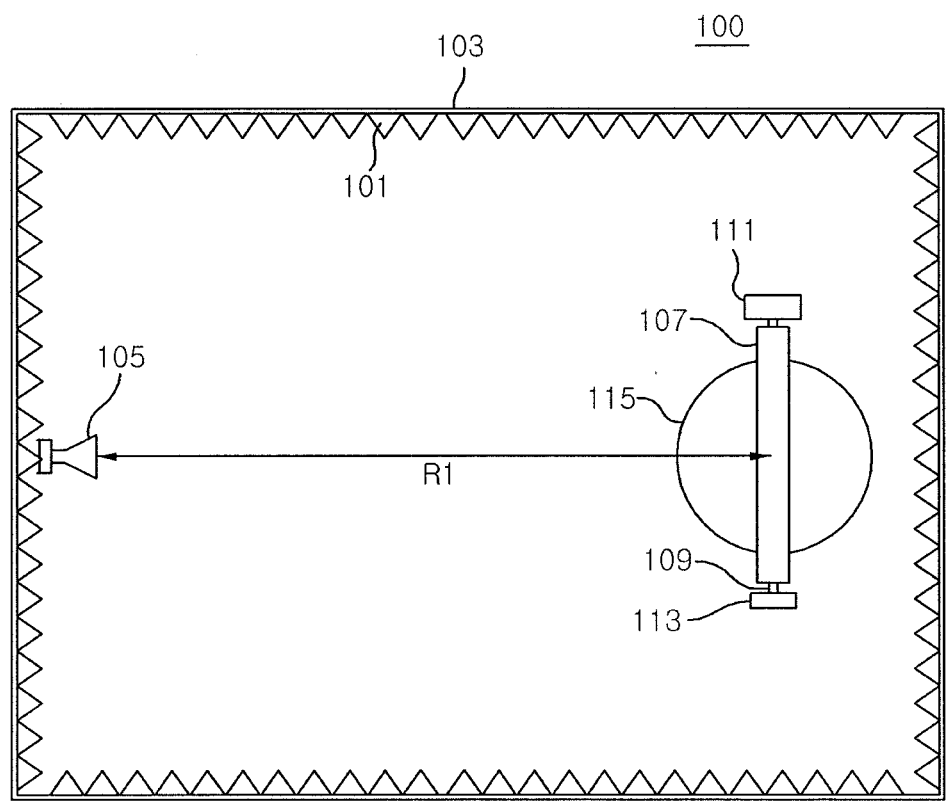
FIG. 1A is a top view showing an apparatus for measuring radiated power of an antenna in accordance with a first embodiment of the present invention.
Figure 1B:
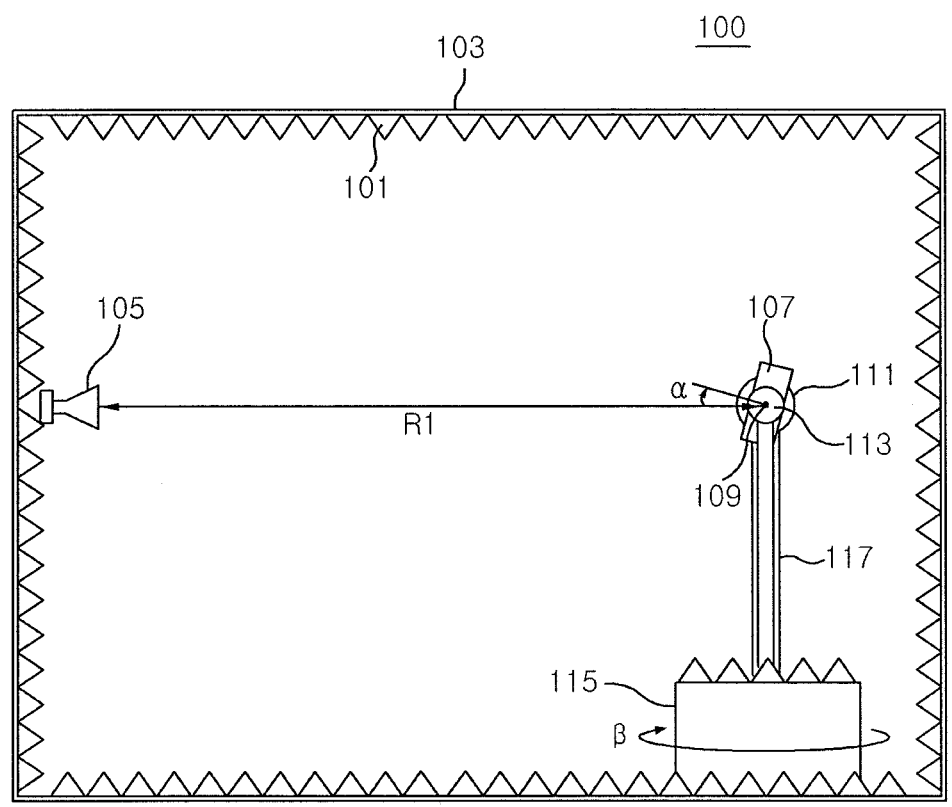
FIG. 1B is a side view showing the apparatus for measuring the radiated power of the antenna shown in FIG. 1A, which may measure the radiated power of a large and medium-sized antenna.

FIG. 1A is a top view showing an apparatus for measuring radiated power of an antenna in accordance with a first embodiment of the present invention, and FIG. 1B is a side view showing the apparatus for measuring the radiated power of the antenna shown in FIG. 1A, which may measure the radiated power of a large and medium-sized antenna. As shown in FIGS. 1A and 1B, the apparatus for measuring radiated power of an antenna 100 in accordance with the first embodiment of the present invention may include a chamber 103 which an absorber 101 is attached to a wall thereof; a source antenna 105 and a test antenna 107 arranged within the chamber 103; a rotational axis 109 allowing the test antenna 107 to rotate in up-and-down directions; a roll positioner 111 allowing the rotational axis 109 to rotate in the up-and-down directions to adjust the arrangement angle of the test antenna 107 in the up and down directions; a supporting unit 113 rotatably connected to one end of the rotational axis 109 which the other end thereof is rotatably connected to the roll positioner 111; a turntable 115 provided within the chamber 103, the turntable 115 being ratatable in left-to-right direction; and a connection unit 117 allowing the test antenna 107 to rotate in the left-to-right direction while the turntable 115 being rotated. Here, the left-to-right direction refers to the direction that is orthogonal to the up-and-down directions.

The one side of the connection unit 117 is connected to the turntable 115 and the other side of the connection unit 117 is connected to the roll positioner 111 and the supporting unit 113, the test antenna 107 being rotatable in the up-and-down directions, and the rotational axis 109 passes through the center of the test antenna 107 while being connected to a rotation point of the roll positioner 111.

Figure 2:
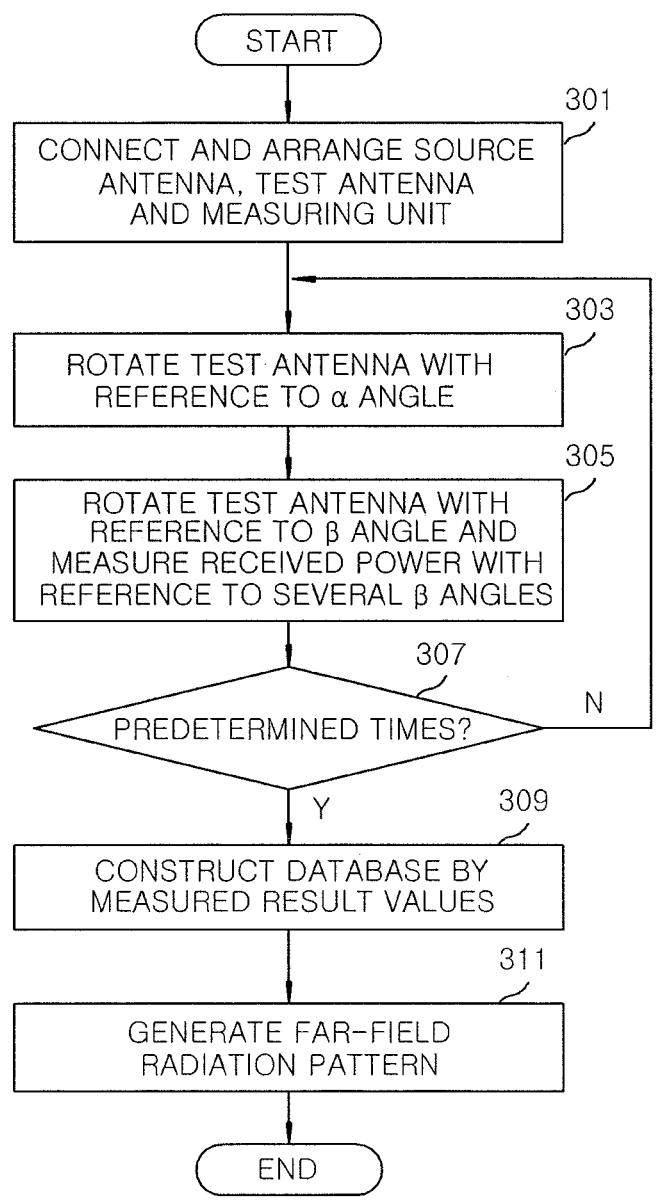
FIG. 2 is a flow chart showing a method for measuring the radiated power using the apparatus for measuring the radiated power of the antenna shown in FIGS. 1A and 1B.

FIG. 2 is a flow chart showing a method for measuring the radiated power using the apparatus for measuring the radiated power of the antenna shown in FIGS. 1A and 1B.

As shown in FIG. 2, the method for measuring the radiated power of the antenna may include connecting and arranging the source antenna 105 and the test antenna 107 in operation 301; setting an α angle in which the test antenna 107 is arranged with reference to the source antenna 105 in the up-and-down directions by driving the roll positioner 111 capable of adjusting the α angle (i.e., arrangement angle of the test antenna) in the up-and-down directions among the source antenna 105 and the test antenna 107 which are arranged within the chamber 103 of which the absorber 101 is attached to a wall in operation 303; setting an β angle in which the test antenna 107 is arranged with reference to the source antenna 105 in the left-to right direction by rotating the turntable 115 which is provided in the chamber 103 and is rotatable in the left-to-right directions orthogonal to the up-and-down directions to rotate the test antenna 107 connected to the turntable 115 through the connection unit 117 in the left-to-right directions, and measuring the received power of the test antenna 107 at the angle α and angle β in the in operation 305; repeatedly measuring the received power of the test antenna 107 predetermined times while adjusting the angle α by driving the roll positioner 111 and adjusting the angle β by driving the turntable 115 in operation 307; constructing a database (DB) using the measured values in operation 309; and generating a far-field radiation pattern using the repeatedly measured values of the received power of the DB in operation 311.

Hereinafter, the process of measuring the radiated power of the antenna will be described in detail using the apparatus for measuring the radiated power of the antenna 100 in accordance with a first embodiment of the present invention.

When a far-field measuring method is performed, the maximum point of the received power of the test antenna 107 is searched while rotating the rotational axis 109 passing through the test antenna 107 by driving a motor provided in the roll positioner 111. Thereafter, by rotating a turntable 115, the radiation pattern according to the angel β is obtained.

At this time, the distance R1 between the source antenna 105 and the test antenna 107 needs to satisfy the far-field conditions (R=2*D2/λ) in order to obtain an accurate antenna gain and the radiation pattern. Further, there are many cases that the far-field conditions are not satisfied due to the size of the antenna and the size of the chamber. However, the accurate antenna gain and radiation pattern may be obtained by the method for measuring the radiated power in accordance with an embodiment of the present invention.

First, the source antenna 105, the test antenna 107 and a measuring unit (not shown) are connected and arranged in operation 301, and the test antenna 107 may be rotated with reference to the α angle by driving the motor provided in the roll positioner 111 to rotate the rotational axis 109 in the up-and-down directions in operation 303.

Then, the received power $E_R$ of the test antenna 107 may be measured with reference to several β angles by rotating the turntable 115 in the left-to-right directions in operation 305.

Thereafter, the α angle of the test antenna 107 is changed by driving the motor provided in the roll positioner 111 again to rotate the rotational axis 109 in the up-and-down directions, then the received power $E_R$ of the test antenna 107 may be measured with reference to the several β angles by rotating the turntable 115 in the up-and-down directions.

Likewise, the received power $E_R$ of the test antenna 107 with reference to the several β angles may be repeatedly measured predetermined times with reference to the several α angles in operation 307.

Thereafter, a database (DB) may be constructed by the result values of performing operations 303 to 307 in operation 309, the far-field radiation pattern $E_{far}$ may be generated by inputting the result values in the Equation 1 below in operation 311.

$$E_{far}(\alpha, \beta) = \sum_{m=-M}^{+M} \sum_{n=-N}^{+N} k_{mn} E_R(\alpha + m\Delta\alpha, \beta + n\Delta\beta) \quad \text{[Equation 1]}$$

wherein, $\Delta\alpha = \lambda/Tx$, $\Delta\beta = \lambda/Ty$, and Tx and Ty are the size of the aperture. Further, $k_{mn}$ is defined by the following Equation 2 and Equation 3.

$$k_{mn} = \frac{1}{T_x T_y} \int_{-T_x/2}^{T_x/2} e^{+ic^2 u^2} e^{-i\frac{2\pi}{T_x}mu} du \int_{-T_y/2}^{T_y/2} e^{+ic^2 v^2} e^{-i\frac{2\pi}{T_y}nv} dv \quad \text{[Equation 2]}$$

$$C^2 = \pi/\lambda R \quad \text{[Equation 3]}$$

Further, referring back to FIGS. 1A and 1B, the same result may be obtained even though the RF transmission and reception locations of the source antenna 105 and test antenna 107 are exchanged. Furthermore, equivalent rated power may be measured.

The rotational axis 109 of the apparatus 100 for measuring the radiated power of the antenna shown in FIGS. 1A and 1B passes through the center of the test antenna 107, and the test antenna 107 is arranged between the roll positioner 111 and the supporting unit 113. Here, when the size of the antenna is larger than the distance between the roll positioner 111 and the supporting unit 113, it is difficult to place the antenna between the roll positioner 111 and the supporting unit 113 because the distance therebetween is fixed when the apparatus for measuring the radiated power of the antenna is constructed.

Figure 3A:
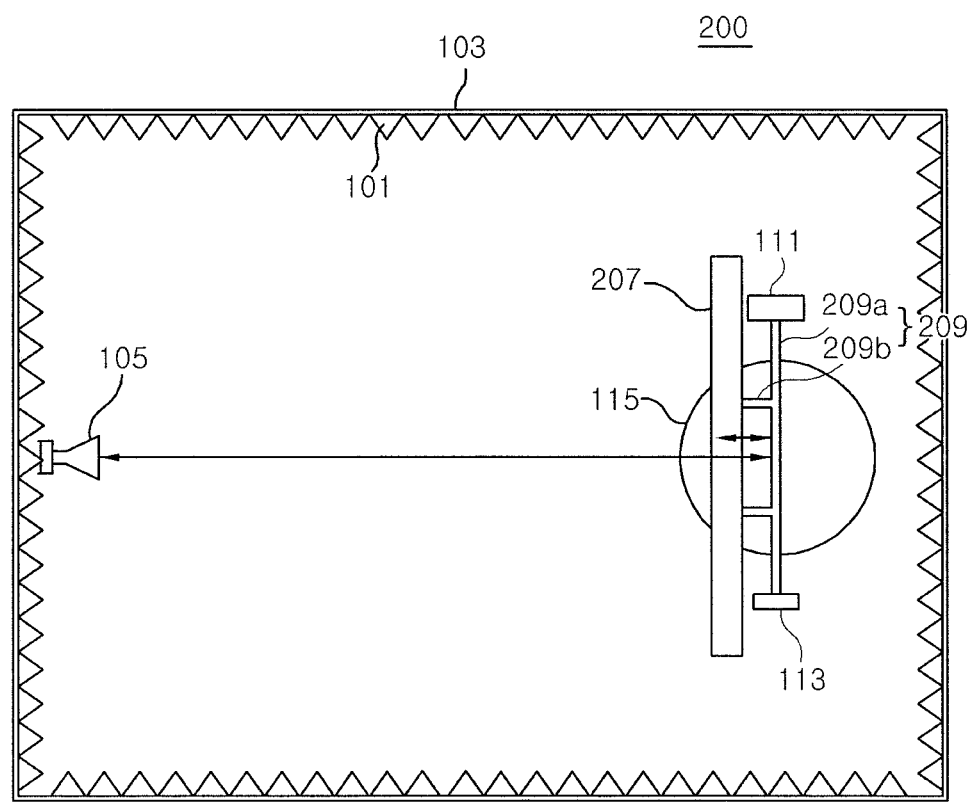
FIG. 3A is a top view showing an apparatus for measuring radiated power of an antenna in accordance with a second embodiment of the present invention.
Figure 3B:
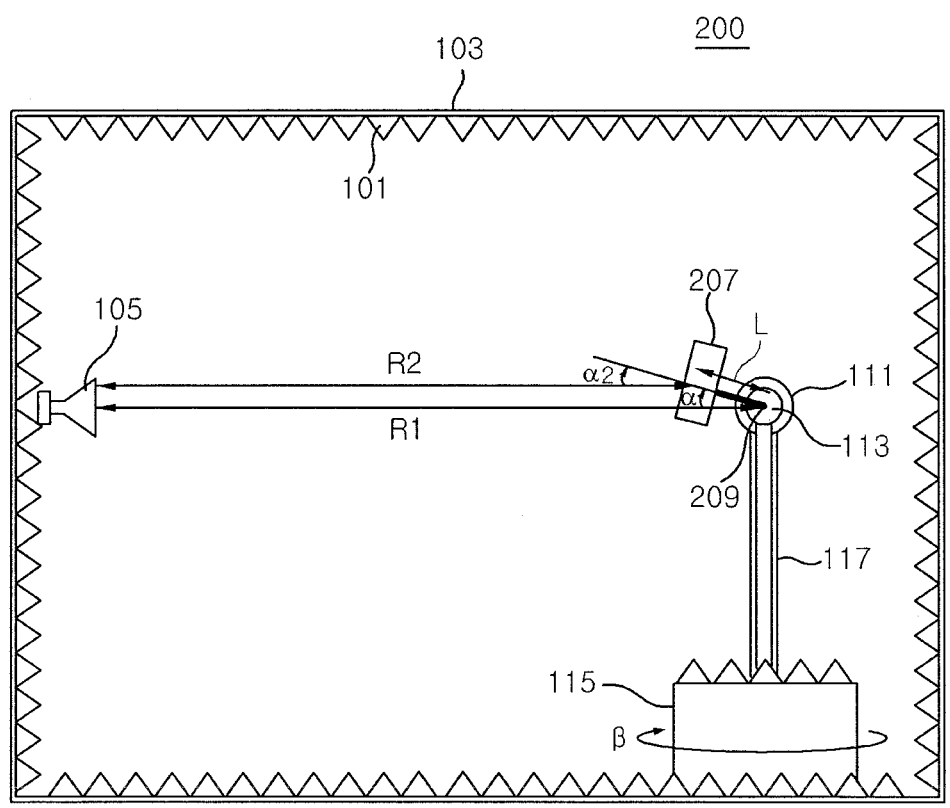
FIG. 3B is a side view showing the apparatus for measuring the radiated power of the antenna shown in FIG. 3A, which may measure radiated power of a supersized antenna.

FIGS. 3A and 3B are showing the apparatus for measuring the radiated power of the antenna, which are capable of measuring the radiated power even if the size of the antenna is very large.

FIG. 3A is a top view showing the apparatus for measuring the radiated power of the antenna in accordance with a second embodiment of the present invention, and FIG. 3B is a side view showing the apparatus for measuring the radiated power of the antenna shown in FIG. 3A, which may measure radiated power of a supersized antenna.

As shown in FIGS. 3A and 3B, the apparatus 200 for measuring the radiated power of the antenna may include a chamber 103 which an absorber 101 is attached to a wall thereof; a source antenna 105 and a test antenna 207 arranged within the chamber 103; a rotational axis 209 allowing the test antenna 107 to rotate in up-and-down directions; a roll positioner 111 capable of adjusting the arrangement angle of the test antenna 207 (i.e., α angle shown in FIG. 3B) in the up-and-down directions by rotating the rotational axis 209 in the up-and-down directions; a supporting unit 113 rotatably connected to one end of the rotational axis 209 which the other end thereof is rotatably connected to the roll positioner 111; a turntable 115 which is provided in the chamber 113 and is rotatable in the left-to-right direction; and a connection unit 117 allowing the test antenna 207 to rotate in the left-to-right direction while the turntable 115 is being rotated. Here, the left-to-right direction refers to the direction that is orthogonal to the up-and-down directions.

The one side of the connection unit 117 is connected to the turntable 115 and the other side of the connection unit 117 is connected to the roll positioner 111 and the supporting unit 113 in order for the test antenna 207 to rotate in the up-and-down directions. The rotational axis 209 may include a main axis 209a connected to a rotation point of the roll positioner 111 and a protrusion 209b which is protruded toward the source antenna 105 and connected to the main axis 209a, and the test antenna 207 is connected to the protrusion 209b of the rotational axis 209.

Figure 4:
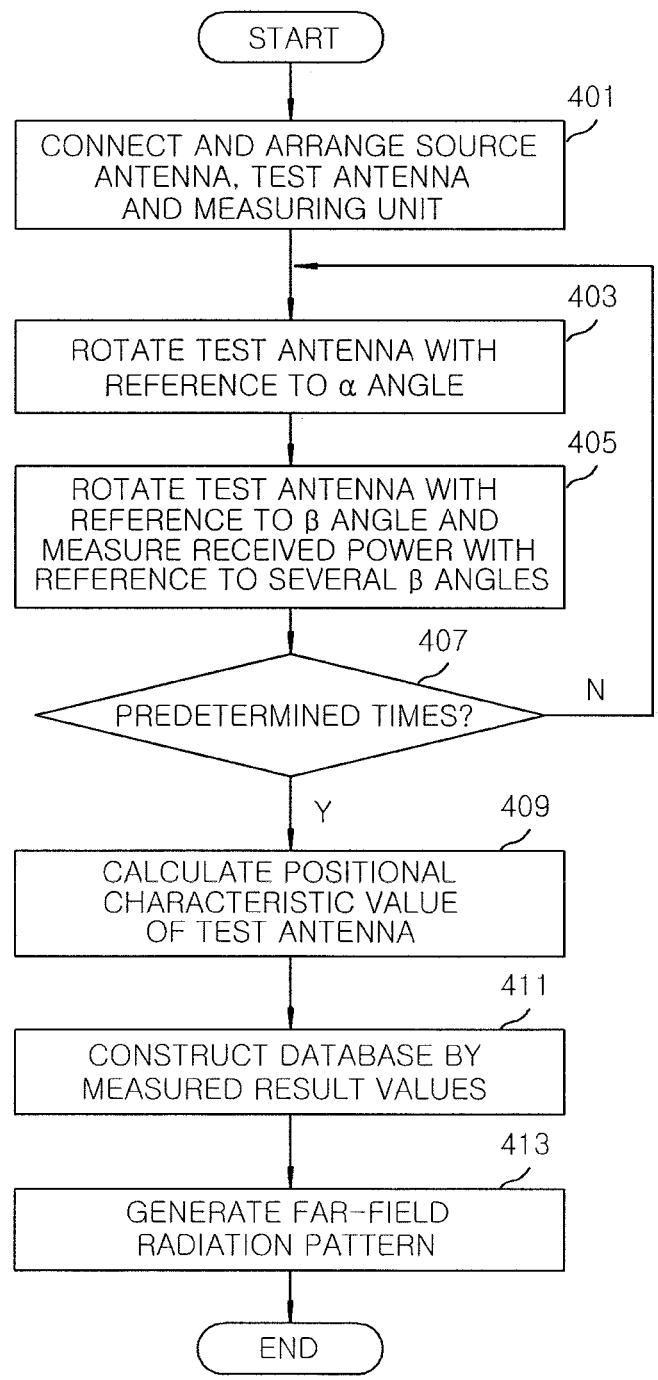
FIG. 4 is a flow chart showing a method for measuring the radiated power using the apparatus for measuring the radiated power of the antenna shown in FIGS. 3A and 3B.

FIG. 4 is a flow chart showing a method for measuring the radiated power using the apparatus for measuring the radiated power of the antenna shown in FIGS. 3A and 3B.

As shown in FIG. 4, the method for measuring the radiated power of the antenna may include connecting and arranging the source antenna 105 and the test antenna 107 in operation 401; setting an α angle in which the test antenna 207 is arranged with reference to the source antenna 105 by driving the roll positioner 111 capable of adjusting the α angle (i.e., arrangement angle of the test antenna) in the up-and-down directions among the source antenna 105 and the test antenna 207 which are arranged within the chamber 103 which the absorber 101 is attached to a wall thereof in operation 403; setting an angle β in which the test antenna 207 is arranged with reference to the source antenna 105 by rotating the turntable 115 which is provided in the chamber 103 and is rotatable in the left-to-right directions orthogonal to the up-and-down directions to rotate the test antenna 207 connected to the turntable 115 through the connection unit 117 in the left-to-right directions, and measuring the received power of the test antenna 207 at the angle α and angle β in the in operation 405; repeatedly measuring the received power of the test antenna 207 predetermined times while adjusting the angle α by driving the roll positioner 111 and adjusting the angle β by driving the turntable 115 in operation 407; when the test antenna 207 is protrudedly provided from the rotational axis of the roll positioner 111 through the protrusion 209b, calculating a positional characteristic value of the test antenna, which includes an angle α2 which the test antenna 207 is arranged with reference to the source antenna 105 in operation 409; constructing a database (DB) by the result values of performing operations 403 to 407 in operation 411; and generating the far-field radiation pattern in operation 413.

Hereinafter, the process of measuring the radiated power of the antenna will be described in more detail using the apparatus 200 for measuring the radiated power of the antenna in accordance with a second embodiment of the present invention.

Generally, when the radiated power of the antenna is measured, the center of the test antenna needs to be located in the center of a turntable. As shown in FIG. 3A, if the test antenna 207 is connected to the protrusion 209b of rotational axis 209 to be protruded, a rotation center is changed so that the antenna gain and radiation pattern are changed. The present invention provides a method for accurately measuring the radiation power of the antenna even though the rotation center is changed.

When a far-field measurement method is performed, the maximum point of received power of the test antenna 207 is searched while rotating the rotational axis 209 to which the test antenna 207 is connected by driving a motor provided in the roll positioner 111. Thereafter, the radiation pattern according to the theta angel is obtained by rotating the turntable 115. At this time, in order to obtain accurate antenna gain and a radiation pattern, the distance R1 between the source antenna 105 and the test antenna 207 needs to satisfy the far-field conditions (R=2*D2/λ). However, there are many cases that the far-field conditions are not satisfied due to the size of the antenna and the size of the chamber. However, the accurate gain and radiation pattern may be obtained by the method for measuring the radiated power in accordance with an embodiment of the present invention.

First, the source antenna 105, the test antenna 207 and a measuring unit (not shown) are connected and arranged in operation 401, and the test antenna 207 may be rotated with reference to the α angle by driving the motor provided in the roll positioner 111 to rotate the rotational axis 109 in the up-and-down directions in operation 403.

Then, the received power $E_R$ of the test antenna 207 may be measured with reference to several β angles by rotating the turntable 115 in the left-to-right directions in operation 405.

Thereafter, the α angle of the test antenna 107 is changed by driving the motor provided in the roll positioner 111 again to rotate the rotational axis 109 in the up-and-down directions, then the received power $E_R$ of the test antenna 107 may be measured with reference to the several β angles by rotating the turntable 115 in the up-and-down directions.

Likewise, the received power $E_R$ of the test antenna 207 with reference to the several β angles may be repeatedly measured predetermined times with reference to the several α angles in operation 407.

Then, positional characteristic values of the test antenna 207 such as distance R2, $α_2$ angle, coefficient Pmn and the like may be measured by Equation 4, Equation 5, Equation 6, and Equation 7 below in operation 409.

$$R_2 = \sqrt{R_1^2 + L^2 - 2R_1 L \cos α} \qquad \text{[Equation 4]}$$

$$α_2 = 180 - \cos^{-1}\left(\frac{R_2^2 + L^2 - R_1^2}{2R_2 L}\right) \qquad \text{[Equation 5]}$$

$$p_{mn} = \frac{1}{T_x T_y} \int_{-T_x/2}^{T_x/2} e^{+is^2 u^2} e^{-i\frac{2\pi}{T_x} mu} du \int_{-T_y/2}^{T_y/2} e^{+is^2 v^2} e^{-i\frac{2\pi}{T_y} nv} dv \qquad \text{[Equation 6]}$$

$$S^2 = \pi/\lambda R_2 \qquad \text{[Equation 7]}$$

Thereafter, a database (DB) may be constructed by the result values of performing operations 403 to 407 in operation 411, the far-field radiation pattern Efar may be generated by inputting the result values in the Equation 1 below in operation 413.

$$E_{far}(α, β) = \sum_{m=-M}^{+M} \sum_{n=-N}^{+N} p_{mn} \cdot \{E_{R2}(α_2 + mΔα_2, β + nΔβ)\} \qquad \text{[Equation 8]}$$

Here, Δα=λ/Tx, Δβ=λ/Ty, and Tx and Ty are the size of the aperture.

Further, referring back to FIGS. 3A and 3B, the same result may be obtained even though the RF transmission and reception locations of the source antenna 105 and test antenna 207 are exchanged. Furthermore, equivalent rated power may be measured.

While the invention has been shown and described with respect to the embodiments, the present invention is not limited thereto. It will be understood by those skilled in the art that various changes and modifications may be made without departing from the scope of the invention as defined in the following claims.

What is claimed is:
1. An apparatus for measuring radiated power of a high-gain antenna, comprising:
a chamber which an absorber is attached to a wall thereof;
a source antenna and a high-gain test antenna configured to be arranged within the chamber;
a rotational axis configured to adjust an arrangement angle of the high-gain test antenna in up-and-down directions;

a roll positioner disposed at a first end of the rotational axis and configured to rotate the high-gain test antenna while making the rotational axis a center to adjust the arrangement angle in the up-and-down directions;

a turntable configured to be provided within the chamber and capable of rotating in a left-to-right direction orthogonal to the up-and-down directions;

a connection unit configured to allow the high-gain test antenna to rotate in the left-to-right direction while the turntable is being rotated; and a supporting unit configured to be rotatably connected to one end of the rotational axis which the other end thereof is rotatably connected to the roll positioner, wherein the connection unit is connected to both the supporting unit and the roll positioner.

2. The apparatus of claim 1, wherein the connection unit is configured such that one end of the connection unit is connected to the turntable and the other end of the connection unit is connected to the roll positioner and the supporting unit for the high-gain test antenna to be rotated in the up-and-down directions.

3. The apparatus of claim 2, wherein the rotational axis passes through a center of the high-gain test antenna while being connected to a rotation point of the roll positioner.

4. The apparatus of claim 2, wherein the rotational axis includes a main axis connected to the rotation point of the roll positioner and protrusions connected to the main axis and protruded toward the source antenna, and wherein the high-gain test antenna is connected to the protrusions.

5. A method for measuring radiated power of an antenna, the method comprising:

setting an angle $\alpha$ in which a high-gain test antenna is arranged with reference to a source antenna by driving the roll positioner which adjusts the angle of the high-gain test antenna in up-and-down directions among the source antenna and the high-gain test antenna which are arranged within the chamber which an absorber is attached to a wall thereof;

setting an angle $\beta$ in which the high-gain test antenna is arranged with reference to the source antenna by rotating a turntable which is provided in the chamber and is rotatable in the left-to-right directions orthogonal to the up-and-down directions to rotate the high-gain test antenna connected to the turntable through the connection unit in the left-to-right directions;

measuring received power of the high-gain test antenna at the angles which the high-gain test antenna is arranged in the up-and-down directions and left-to-right direction;

repeatedly measuring the received power of the high-gain test antenna predetermined times while driving the roll positioned to adjust the angle $\alpha$ which the high-gain test antenna is arranged in the up-and-down directions and driving the turntable to adjust the angle $\beta$ which the high-gain test antenna is arranged in the left-and-right direction; and generating a far-field radiation pattern $E_{far}$ using the repeatedly measured values of the received power, wherein $E_{far}$ is given by:

$$E_{far}(\alpha, \beta) = \sum_{m=-M}^{+M} \sum_{n=-N}^{+N} k_{mn} E_R(\alpha + m\Delta\alpha, \beta + n\Delta\beta),$$

where R is the distance between the source antenna and the rotational axis, $\Delta\alpha = \lambda/Tx$, $\Delta\beta = \lambda/Ty$, and Tx and Ty are the size of an aperture and $k_{mn}$ is given by:

$$k_{mn} = \frac{1}{T_x T_y} \int_{-T_x/2}^{T_x/2} e^{+ic^2 u^2} e^{-i\frac{2\pi}{T_x} mu} du \int_{-T_y/2}^{T_y/2} e^{+ic^2 v^2} e^{-i\frac{2\pi}{T_y} nv} dv,$$

where $c^2$ is given by:

$$c^2 = {}^{90}f_{80R}.$$

6. A method for measuring radiated power of an antenna, the method comprising:

setting an angle $\alpha$ in which a high-gain test antenna is arranged with reference to a source antenna by driving the roll positioner which adjusts the angle of the high-gain test antenna in up-and-down directions among the source antenna and the high-gain test antenna which are arranged within the chamber which an absorber is attached to a wall thereof;

setting an angle $\beta$ in which the high-gain test antenna is arranged with reference to the source antenna by rotating a turntable which is provided in the chamber and is rotatable in the left-to-right directions orthogonal to the up-and-down directions to rotate the high-gain test antenna connected to the turntable through the connection unit in the left-to-right directions;

measuring received power of the high-gain test antenna at the angles which the high-gain test antenna is arranged in the up-and-down directions and left-to-right direction;

repeatedly measuring the received power of the high-gain test antenna predetermined times while driving the roll positioned to adjust the angle $\alpha$ which the high-gain test antenna is arranged in the up-and-down directions and driving the turntable to adjust the angle $\beta$ which the high-gain test antenna is arranged in the left-and-right direction; and when the high-gain test antenna is protrudedly provided from the rotational axis of the roll positioner through the protrusion, calculating a positional characteristic value of the high-gain test antenna, which includes an angle which the high-gain test antenna is arranged with reference to the source antenna, wherein the positional characteristic include a distance $R2$ between the source antenna and the high-gain test antenna, an angle $\alpha2$ between the source antenna and the high-gain test antenna, and a coefficient Pmn, wherein $R_2$ is given by:

$$R_2 = \sqrt{R_1^2 + L^2 - 2R_1 L \cos\alpha},$$

where $\alpha2$ is given by:

$$\alpha_2 = 180 - \cos^{-1}\left(\frac{R_2^2 + L^2 - R_1^2}{2R_2 L}\right),$$

where Pmn is given by:

$$p_{mn} = \frac{1}{T_x T_y} \int_{-T_x/2}^{T_x/2} e^{+is^2 u^2} e^{-i\frac{2\pi}{T_x} mu} du \int_{-T_y/2}^{T_y/2} e^{+is^2 v^2} e^{-i\frac{2\pi}{T_y} nv} dv$$

where $S^2$ is given by:

$S^2 = \pi/\lambda R_2$; and generating the far-field radiation pattern $E_{far}$ using the result value of the received power and the positional characteristic value, where Efar is given by:

$$E_{far}(\alpha, \beta) = \sum_{m=-M}^{+M} \sum_{n=-N}^{+N} p_{mn} \cdot [E_{Rz}(\alpha_2 + m\Delta\alpha_2, \beta + n\Delta\beta)],$$

where, $\Delta\alpha = \lambda/Tx$, $\Delta\beta = \lambda/Ty$, and Tx and Ty are the size of an aperture.

* * * * *